US008299453B2

(12) United States Patent
Zhu

(10) Patent No.: US 8,299,453 B2
(45) Date of Patent: Oct. 30, 2012

(54) CMOS TRANSISTORS WITH SILICON GERMANIUM CHANNEL AND DUAL EMBEDDED STRESSORS

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 250 days.

(21) Appl. No.: 12/699,225

(22) Filed: Feb. 3, 2010

(65) Prior Publication Data

US 2010/0224938 A1 Sep. 9, 2010

Related U.S. Application Data

(60) Provisional application No. 61/156,960, filed on Mar. 3, 2009.

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. .................. 257/19; 257/351; 257/E27.064

(58) Field of Classification Search ............... 257/19, 257/351, E27.064
See application file for complete search history.

(56) References Cited

U.S. PATENT DOCUMENTS 7,288,448 B2 * 10/2007 Orlowski et al. ............. 438/198
7,470,972 B2 * 12/2008 Kavalieros et al. ........... 257/615

* cited by examiner

*Primary Examiner* — Thien F Tran
(74) *Attorney, Agent, or Firm* — Scully, Scott, Murphy & Presser, P.C.; H. Daniel Schnurmann

(57) ABSTRACT

A p-type MOSFET of a CMOS structure has a silicon-germanium alloy channel to which a longitudinal compressive stress is applied by embedded epitaxial silicon-germanium alloy source and drain regions comprising a silicon-germanium alloy having a higher concentration of germanium than the channel of the p-type MOSFET. An n-type MOSFET of the CMOS structure has a silicon-germanium alloy channel to which a longitudinal tensile stress is applied by embedded epitaxial silicon source and drain regions comprising silicon. The silicon-germanium alloy channel in the p-type MOSFET provides enhanced hole mobility, while the silicon-germanium alloy channel in the n-type MOSFET provides enhanced electron mobility, thereby providing performance improvement to both the p-type MOSFET and the n-type MOSFET.

14 Claims, 16 Drawing Sheets

CMOS TRANSISTORS WITH SILICON GERMANIUM CHANNEL AND DUAL EMBEDDED STRESSORS

This non-provisional application claims the benefit of the provisional application filed with the United States Patent and Trademark Office as Ser. No. 61/156,960 entitled "CMOS Transistors With Silicon Germanium Channel and Dual Embedded Stressors", filed Mar. 3, 2009.

FIELD OF THE INVENTION

The present invention generally relates to semiconductor devices, and particularly to complementary metal-oxide-semiconductor (CMOS) field effect transistors having a silicon-germanium alloy channel and dual stressors for generating tensile or compressive longitudinal stress along the channel, and methods of manufacturing the same.

BACKGROUND OF THE INVENTION

Carrier mobility in a metal oxide semiconductor field effect transistor (MOSFET) may be manipulated by a stress applied to the channel of the MOSFET. Even relatively small changes in the stress of the channel may result in large changes in carrier mobility for some combinations of semiconductor material and crystallographic orientations, and may be utilizes to increase the transconductance (or reduced serial resistance) of the MOSFET, thereby enhancing the performance of the MOSFET.

When stress is applied to the channel of a semiconductor transistor, the applied stress and the resulting strain on the semiconductor structure within the channel affects the band gap structure (i.e., breaks the degeneracy of the band structure) and changes the effective mass of carriers. The effect of the stress depends on the crystallographic orientation of the plane of the channel, the direction of the channel within the crystallographic orientation, and the direction of the applied stress. Under stress applied the channel of the MOSFET, the mobility of carriers, and as a consequence, the transconductance and the on-current of the transistor are altered from their original values for an unstressed semiconductor.

The effect of uniaxial stress, i.e., a stress applied along one crystallographic orientation, on the performance of semiconductor devices, especially on the performance of a MOSFET (or a "FET" in short) devices built on a silicon substrate, has been extensively studied in the semiconductor industry. For a p-type MOSFET, i.e., a PMOSFET (or a "PFET" in short) that utilizes a silicon channel or silicon-germanium alloy channel, the mobility of minority carriers in the channel (which are holes in this case) increases under longitudinal compressive stress along the direction of the channel, i.e., the direction of the movement of holes or the direction connecting the drain to the source. Conversely, for an n-type MOSFET, i.e., an NMOSFET (or an "NFET" in short) that utilizes a silicon channel or a silicon-germanium alloy channel, the mobility of minority carriers in the channel (which are electrons in this case) increases under longitudinal tensile stress along the direction of the channel, i.e., the direction of the movement of electrons or the direction connecting the drain to the source. These opposite requirements for the type of stress for enhancing carrier mobility between the PMOSFETs and NMOSFETs have led to prior art methods for applying at least two different types of stress to the semiconductor devices on the same integrated chip.

While such beneficial effects of stress are known in the art, a difficulty arises since two different types of field effect transistors require two different types of stress. Specifically, a longitudinal compressive stress is required or a PMOSFET, and a longitudinal tensile stress is required for an NMOSFET. For a semiconductor circuit employing field effect transistors having a silicon-germanium alloy channel, two separate mechanisms are needed to generate the two opposite types of stress in the channel for PMOSFETs and NMOSFETs.

With scaling down of the critical dimension, it becomes more and more difficult to apply strong stress in both NFET and PFET channel with stress liners. The stress enhancement of embedded source/drain can be used to main device performance with changing lattice constant or fraction of chemical composition in an embedded source and/or an embedded drain.

In view of the above, there exists a need for a semiconductor structure providing a longitudinal compressive stress to a p-type MOSFET having a silicon-germanium alloy channel, while providing a longitudinal stress to an n-type MOSFET having a silicon-germanium alloy channel, and methods of manufacturing the same.

SUMMARY OF THE INVENTION

The present invention provides a semiconductor structure including a p-type MOSFET and an n-type MOSFET. The p-type MOSFET has a silicon-germanium alloy channel to which a longitudinal compressive stress is applied by embedded epitaxial silicon-germanium alloy source and drain regions comprising a silicon-germanium alloy having a higher concentration of germanium than the channel of the p-type MOSFET. The n-type MOSFET has a silicon-germanium alloy channel to which a longitudinal tensile stress is applied by embedded epitaxial silicon source and drain regions comprising silicon. The silicon-germanium alloy channel in the p-type MOSFET provides enhanced hole mobility, while the silicon-germanium alloy channel in the n-type MOSFET provides enhanced electron mobility, thereby providing performance improvement to both the p-type MOSFET and the n-type MOSFET.

According to an embodiment of the present invention, a semiconductor structure comprising a field effect transistor located on a semiconductor substrate is provided. The field effect transistor includes a body region including a channel-containing body portion having a doping of a first conductivity type and comprising a silicon-germanium alloy having a first atomic concentration of germanium and including a channel; a source region having a doping of a second conductivity type and comprising a silicon-germanium alloy having a second atomic concentration of germanium, wherein the second atomic concentration is greater than the first atomic concentration, and wherein the second conductivity type is the opposite of the second conductivity type; and a drain region having a doping of the second conductivity type and comprising a silicon-germanium alloy having the second atomic concentration of germanium.

According to another aspect of the present invention, a semiconductor structure comprising a first field effect transistor and a second field effect transistor located on a semiconductor substrate is provided. The first field effect transistor includes a first body region including a first channel-containing body portion having a doping of a first conductivity type and comprising a silicon-germanium alloy having a first atomic concentration of germanium and including a first channel; a first source region having a doping of a second conductivity type and comprising a silicon-germanium alloy having a second atomic concentration of germanium, wherein the second atomic concentration is greater than the first atomic concentration, and wherein the second conductivity type is the opposite of the second conductivity type; and a first drain region having a doping of the second conductivity type and comprising a silicon-germanium alloy having the second atomic concentration of germanium. The second field effect transistor includes a second body region including a second channel-containing body portion having a doping of second conductivity type and comprising a silicon-germanium alloy having the first atomic concentration of germanium and including a second channel; a second source region having a doping of the first conductivity type and comprising silicon and being substantially free of germanium; and a second drain region having a doping of first conductivity type and comprising silicon and being substantially free of germanium.

According to yet another aspect of the present invention, a method of forming a semiconductor device is provided. The method includes forming a gate electrode structure including at least one dielectric spacer in a device region on a silicon-germanium alloy layer comprising a single crystalline silicon-germanium alloy having a first atomic concentration of germanium; forming a source-side embedded silicon region and a drain-side embedded silicon region in the silicon-germanium alloy layer in the device region; removing a portion of the source-side embedded silicon region and a portion of the drain-side embedded silicon region from the device region; forming a source-side embedded silicon-germanium alloy region having a second atomic concentration of germanium on a remaining portion of the source-side embedded silicon region, wherein the second atomic concentration of germanium is greater than the first atomic concentration of germanium; and forming a drain-side embedded silicon-germanium alloy region having the second atomic concentration of germanium on a remaining portion of the drain-side embedded silicon region.

BRIEF DESCRIPTION OF THE DRAWINGS

FIG. 1 corresponds to a step after patterning of a threshold voltage adjustment dielectric layer and a lower metal gate layer.

FIG. 2 corresponds to a step after formation of an upper metal gate layer, a gate semiconductor layer, and a gate cap dielectric layer.

FIG. 3 corresponds to a step after formation of dielectric gate caps, gate semiconductor portions, and a first metal gate portion and a second metal gate portion.

FIG. 4 corresponds to a step after formation of a first gate stack in a first device region and a second gate stack in a second device region.

FIG. 5 corresponds to a step after formation of first source and drain extension regions, second source and drain extension regions, first dielectric spacers, and second dielectric spacers.

FIG. 6 corresponds to a step after formation of first trenches in the first device region and second trenches in the second device region.

FIG. 7 corresponds to a step after formation of first embedded silicon regions in the first device region and second embedded silicon region in the second device region.

FIG. 8 corresponds to a step after upper source and drain regions in the second device region.

FIG. 9 corresponds to a step after formation of a third dielectric spacer and a fourth dielectric spacer in the first device region.

FIG. 10 corresponds to a step after formation of third trenches under the third and fourth dielectric spacers in the first device region.

FIG. 11 corresponds to a step after extending the depth of the third trenches by an anisotropic etch.

FIG. 12 corresponds to a step after formation of embedded silicon-germanium alloy regions.

FIG. 13 corresponds to a step after formation of lower source and drain regions in the second device region and removal of a dielectric gate cap from the second device region.

FIG. 14 corresponds to a step after removal of a dielectric gate cap from the first device region.

FIG. 15 corresponds to a step after formation of various metal semiconductor alloy regions.

FIG. 16 corresponds to a step after formation of a middle-of-line (MOL) dielectric layer and contact vias.

DETAILED DESCRIPTION OF THE INVENTION

As stated above, the present invention relates to complementary metal-oxide-semiconductor (CMOS) field effect transistors having a silicon-germanium alloy channel and dual stressors for generating tensile or compressive longitudinal stress along the channel, and methods of manufacturing the same, which are now described in detail with accompanying figures. The drawings are not necessarily drawn to scale.

Figure 1:
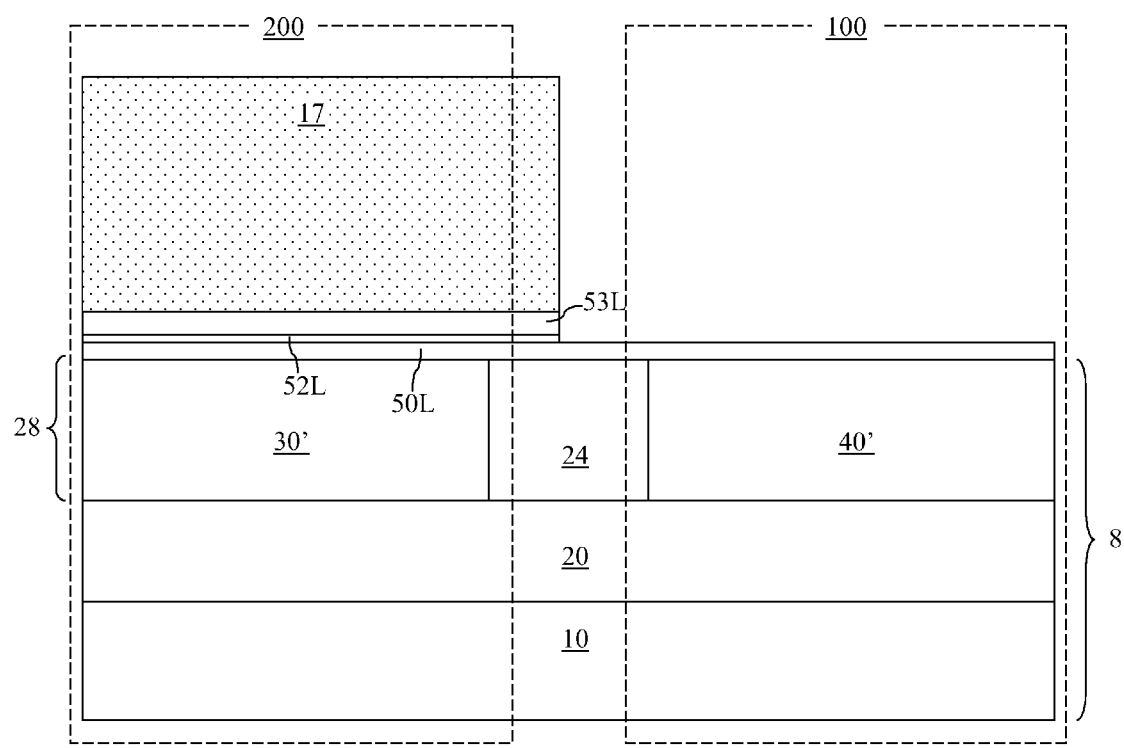
FIGS. 1-16 are sequential vertical cross-sectional views of an exemplary semiconductor structure according to the present invention at various stages of a manufacturing process.

Referring to FIG. 1, an exemplary semiconductor structure according to the present invention is shown, which includes a semiconductor substrate 8 including a bottom substrate layer 10, an intermediate substrate layer 20, and a top semiconductor layer 28. The top semiconductor layer 28 includes a first top semiconductor portion 40' located in a first device region 100 and a second top semiconductor layer 30' located in a second device region 200. The top semiconductor layer 28 includes a shallow trench isolation structure 24, which straddles the first device region 100 and the second device region 200 and separates the first top semiconductor portion 40' and the second top semiconductor portion 30'. The shallow trench isolation structure includes a dielectric material such as silicon oxide and provides electrical isolation of semiconductor devices to be subsequently formed in and on the top semiconductor layer 28.

In one embodiment, the bottom substrate layer 10 includes silicon, and may consist of silicon and optional electrical dopants such as boron, gallium, indium, phosphorus, arsenic, antimony, or a combination thereof. The bottom substrate layer 10 includes single crystalline silicon, i.e., silicon having epitaxial alignment throughout the entirety of the bottom substrate layer.

The intermediate substrate layer 20 includes a graded silicon-germanium alloy that is epitaxially aligned to the single crystalline silicon material of the bottom substrate layer 10. The concentration of germanium monotonically increases in the intermediate substrate layer 20 with a vertical distance from the interface between the bottom substrate layer 10 and the intermediate substrate layer 20. The atomic concentration of germanium in the intermediate substrate layer 20 increases from 0% at the bottom of the intermediate substrate layer 20 to a first atomic concentration at the top of the intermediate substrate layer 20. The first atomic concentration may be from about 1% to about 40%, and preferably from about 5% to about 35%, and more preferably from about 15% to about 30%, although lesser and greater first atomic concentrations are also contemplated herein. The thickness of the intermediate substrate layer 20 may be from about 100 nm to about 5,000 nm, and typically from about 300 nm to about 3,000 nm, although lesser and greater thicknesses are also contemplated herein.

The top semiconductor layer 28 includes an epitaxial single crystalline silicon-germanium alloy having the first atomic concentration of germanium. The first top semiconductor portion 40' and the second top semiconductor portion 30' and all other semiconductor portions (not shown) in the top semiconductor layer 28 is epitaxially aligned to the intermediate substrate layer 20. Thus, the entirety of the bottom semiconductor layer 10, the entirety of the intermediate semiconductor layer 20, and all semiconductor portions of the top semiconductor layer 28 are epitaxially aligned amongst one another. The thickness of the top semiconductor layer 28 may be from about 30 nm to about 600 nm, and typically from about 60 nm to about 300 nm, although lesser and greater thicknesses are also contemplated herein. The first top semiconductor portion 40' and the second top semiconductor portion 30' may be doped with dopants at a relatively low dopant concentration, which may be from about $1.0 \times 10^{16}/cm^3$ to about to about $3.0 \times 10^{18}/cm^3$, although lesser and greater dopant concentrations are explicitly contemplated herein. The epitaxial single crystalline silicon-germanium alloy in the top semiconductor layer 28 is substantially relaxed and substantially stress-free at this step.

In another embodiment, the bottom substrate layer 10 may include a semiconductor material, a metallic material, or an insulator material. The bottom substrate layer 10 may be single crystalline, polycrystalline, or amorphous. For example, the bottom semiconductor layer 10 may include silicon. The intermediate substrate layer 20 includes an insulator material such as silicon oxide, silicon nitride, sapphire, etc. The top semiconductor layer 28 includes an epitaxial single crystalline silicon-germanium alloy having a first atomic concentration of germanium. The range of the first atomic concentration of germanium is the same as described above. Each of the first top semiconductor portion 40' and the second top semiconductor portion 30' and all other semiconductor portions (not shown) in the top semiconductor layer 28 is single crystalline, and may have the same set of crystallographic orientations. The thickness of the top semiconductor layer 28 may be from about 30 nm to about 600 nm, and typically from about 60 nm to about 300 nm, although lesser and greater thicknesses are also contemplated herein. The first top semiconductor portion 40' and the second top semiconductor portion 30' may be doped with dopants at a relatively low dopant concentration, which may be from about $1.0 \times 10^{16}/cm^3$ to about to about $3.0 \times 10^{18}/cm^3$, although lesser and greater dopant concentrations are explicitly contemplated herein. The epitaxial single crystalline silicon-germanium alloy in the top semiconductor layer 28 is substantially relaxed and substantially stress-free at this step. The semiconductor substrate 8 may be a semiconductor-on-insulator (SOI) substrate.

For the purpose of description of the present invention, the first top semiconductor portion 40' and the second top semiconductor portion 30' have different types of doping. The doping type of the first top semiconductor portion 40' is herein referred to as a first conductivity type, and the doping type of the second top semiconductor portion 30' is herein referred to as a second conductivity type. For example, if the first conductivity type is n-type, the second conductivity type is p-type, and vice versa. In a preferred embodiment, the first conductivity type is n-type and the second conductivity type is p-type.

A gate dielectric layer 50L is formed on the top surface of the top semiconductor layer 28. In one embodiment, the gate dielectric layer 50L may include a dielectric metal oxide having a dielectric constant that is greater than the dielectric constant of silicon oxide of 3.9. The dielectric metal oxide is a high-k material containing a metal and oxygen. The dielectric material may be, for example, $HfO_2$, $ZrO_2$, $La_2O_3$, $Al_2O_3$, $TiO_2$, $SrTiO_3$, $LaAlO_3$, $Y_2O_3$, a silicate thereof, a non-stoichiometric variant thereof, and/or an alloy thereof. In one embodiment, the gate dielectric layer 50L includes $HfO_2$. In this case, the thickness of each gate dielectric layer 50L may be from about 1 nm to about 6 nm, and may have an effective oxide thickness on the order of or less than 1 nm.

Optionally, a threshold voltage adjustment dielectric layer 52L may be formed on the gate dielectric layer 50L. The threshold voltage adjustment dielectric layer 52L includes another high-k material containing a metal and oxygen, and may be different from the material of the gate dielectric layer 50L. For example, the threshold voltage adjustment dielectric layer 52L may include $La_2O_3$ and/or $Al_2O_3$. The threshold voltage adjustment dielectric layer 52L alters the threshold voltage of devices to be subsequently formed in the second device region 200. The thickness of the threshold voltage adjustment dielectric layer 52L may be from about 0.1 nm to about 0.5 nm, although lesser and greater thicknesses are also contemplated herein.

A lower metal gate layer 53L is formed on the threshold voltage adjustment dielectric layer 52L. The lower metal gate layer 53L may be formed by chemical vapor deposition (CVD), physical vapor deposition (PVD), atomic layer deposition (ALD), etc. and comprising a conductive refractory metal nitride. For example, the lower metal gate layer 53L may include a material such as TaN, TiN, WN, TiAlN, TaCN, other conductive refractory metal nitride, or an alloy thereof. The thickness of the lower metal gate layer may be from about 5 nm to about 40 nm, and preferably from about 10 nm to about 30 nm. The composition of the lower metal gate layer may be selected to optimize threshold voltages of semiconductor devices to be subsequently formed in the second device region 200.

A first block level photoresist 17 is applied over the lower metal gate layer 53L and lithographically patterned to cover the lower metal gate layer 53L in the second device region 200, while exposing a top surface of the lower metal gate layer 53L in the first device region 100. The portions of the lower metal gate layer 53L and the threshold voltage adjustment dielectric layer 52L in the first device region 100 is removed selective to the gate dielectric layer 50L in the first device region 100 employing an anisotropic etch or an isotropic etch.

Figure 2:
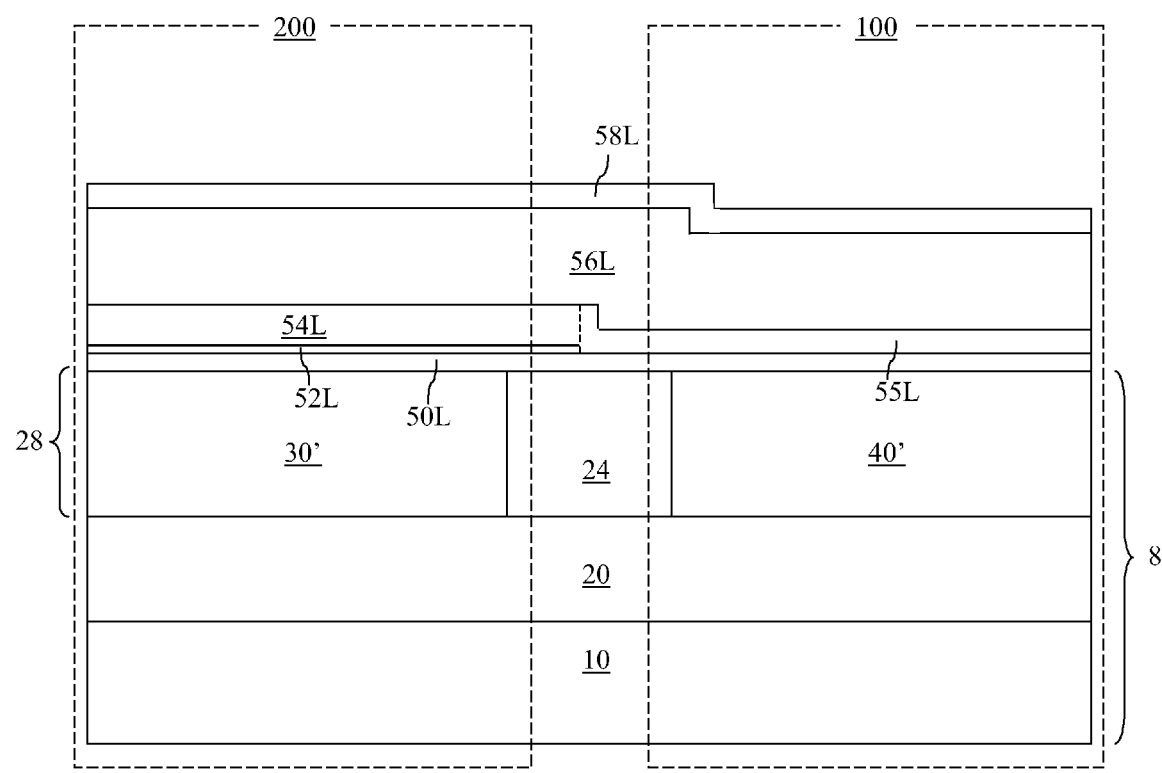

Referring to FIG. 2, an upper metal gate layer 55L is deposited on the gate dielectric layer 50L in the first device region 100 and on the lower metal gate layer 53L (See FIG. 1) in the second device region. The upper metal gate layer 55L may include a material such as TaN, TiN, WN, TiAlN, TaCN, other conductive refractory metal nitride, or an alloy thereof. The upper metal gate layer 55L may include the same material as, or a different material from, the lower metal gate layer 53L. The stack of the lower metal gate layer 53L and the upper metal gate layer 55L in the second device region 200 is herein collectively referred to as a combined metal gate layer 54L. The thickness of the upper metal gate layer 55L may be from about 5 nm to about 30 nm, and typically from about 10 nm to about 20 nm, although lesser and greater thicknesses are also contemplated herein.

A gate semiconductor material layer 56L is formed on the upper metal gate layer 55L, for example, by chemical vapor deposition (CVD). The gate semiconductor material layer 56L includes an amorphous or polycrystalline semiconductor material such as polysilicon, amorphous silicon, a silicon-germanium alloy, a silicon-carbon alloy, a silicon-germanium-carbon alloy, or a combination thereof. The gate semiconductor material layer 56L may be substantially intrinsic, or may be doped. The thickness of the gate semiconductor material layer 56L may be from about 30 nm to about 300 nm, and typically from about 60 nm to about 150 nm, although lesser and greater thicknesses are also contemplated herein. The gate semiconductor material layer 56L may be in-situ doped, or may be doped by a subsequent ion implantation of dopants. Optionally, different portions of the gate semiconductor material layer 56L may be doped differently by masked ion implantation to optimize performance of device to be subsequently formed.

A gate cap dielectric layer 58L is formed on the gate semiconductor material layer 56L, for example, by chemical vapor deposition (CVD). The gate cap dielectric layer 58L includes a dielectric material such as silicon nitride and/or silicon oxide. For example, the gate cap dielectric layer 58L includes silicon nitride. The thickness of the gate cap dielectric layer 58L may be from about 10 nm to about 100 nm, and typically from about 20 nm to about 50 nm, although lesser and greater thicknesses are also contemplated herein.

In another embodiment, the gate dielectric layer 50L may include a silicon oxide based dielectric material such as silicon oxide and/or silicon oxynitride and may be vertically abutted by the gate semiconductor material layer 56L.

Figure 3:
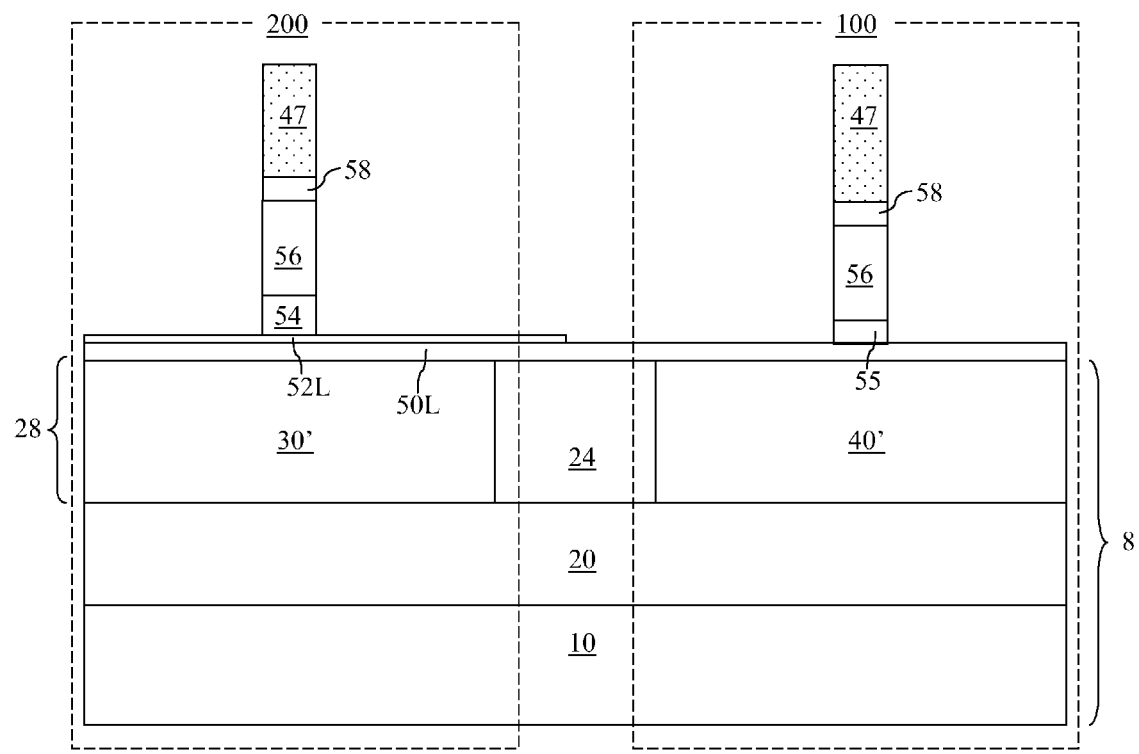

Referring to FIG. 3, a first photoresist 47 is applied over the gate cap dielectric layer 58L (See FIG. 2) and lithographically patterned. An anisotropic etch transfers the pattern in the first photoresist 47 into the gate cap dielectric layer 58L, the gate semiconductor material layer 56L, and the combined metal gate layer 54L or the upper metal gate layer 55L. The anisotropic etch may be a reactive ion etch. The anisotropic etch may, or may not, be selective to the threshold voltage adjustment dielectric layer 52L and/or the gate dielectric layer 50L. Dielectric gate caps 58 are formed from remaining portions of the gate cap dielectric layer 58L. Gate semiconductor portions 56 are formed from remaining portions of the gate semiconductor material layer 56L. A first metal gate portion 55 is formed from a remaining portion of the upper metal gate layer 55L in the first device region 100. A second metal gate portion 54 is formed from a remaining portion of the combined metal gate layer 54L in the second device region 200.

Figure 4:
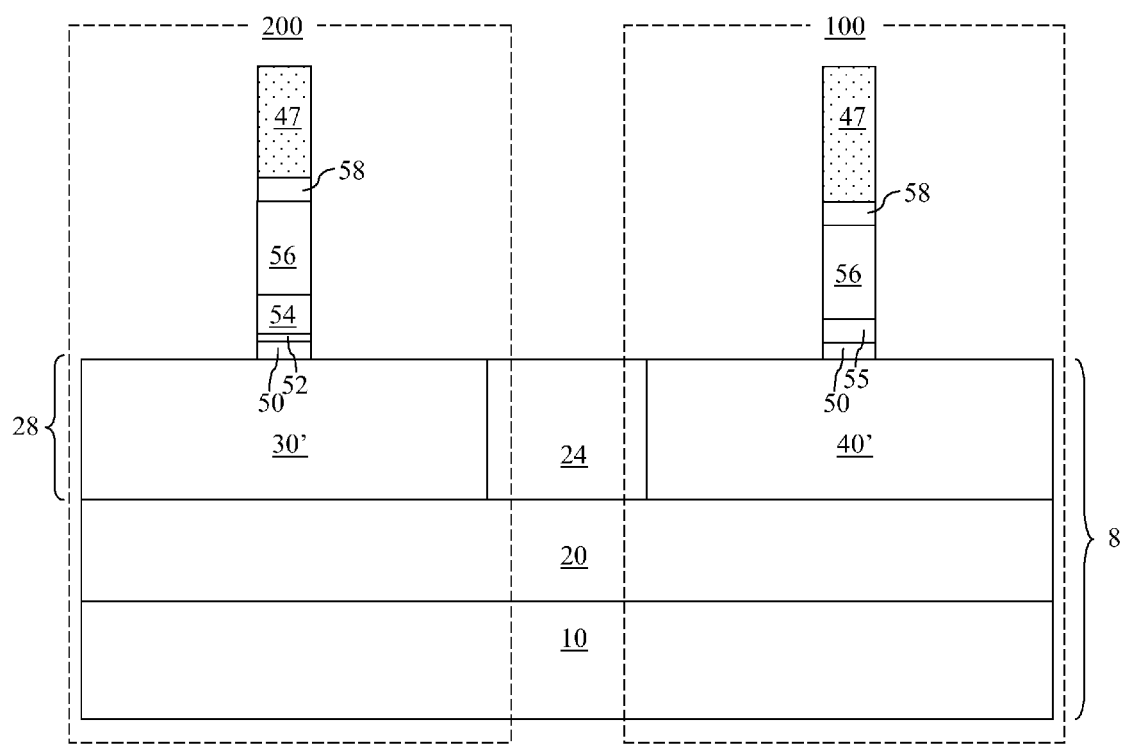

Referring to FIG. 4, the exposed portions of the threshold voltage adjustment dielectric layer 52L and the gate dielectric layer 50L are removed by an etch, which may be an anisotropic etch such as a reactive ion etch or an isotropic etch such as a wet etch. A first gate stack comprising a gate dielectric portion 50, the first metal gate portion 55, a gate semiconductor portion 56, and a dielectric gate cap 58 in the first device region 100. A second gate stack comprising another gate dielectric portion 50, a threshold voltage adjustment dielectric portion 52, the second metal gate portion 55, another gate semiconductor portion 56, and another dielectric gate cap 58 in the second device region 200. The first photoresist 47 may be removed prior to, or after, the formation of the gate dielectric portions 50. The gate dielectric portion 50 in the first device region 100 is a first gate dielectric of a first field effect transistor to be subsequently formed, and the stack of the gate dielectric portion 50 in the second device region 200 and the threshold voltage adjustment dielectric portion 52 is a second gate dielectric of a second field effect transistor to be subsequently formed.

Figure 5:
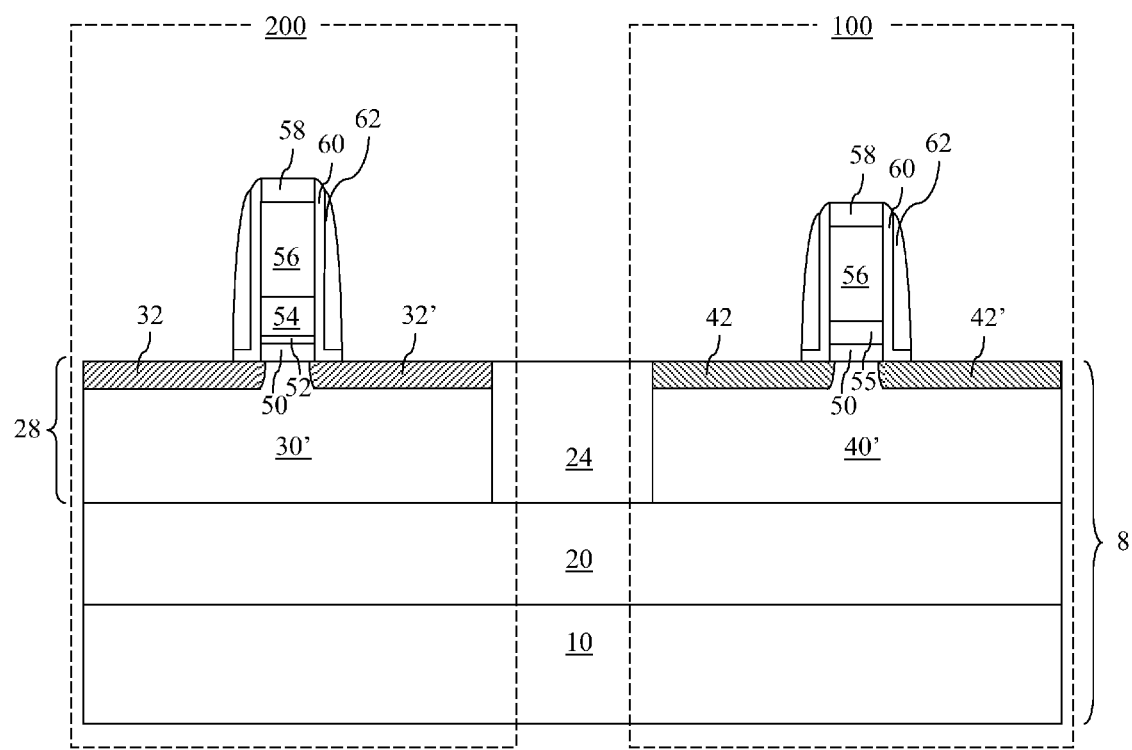

Referring to FIG. 5, masked ion implantation steps are employed to form first source and drain extension regions (42, 42') in the first device region 100 and second source and drain extension regions (32, 32') in the second device region 200. The first source extension region 42 is located on one side of the first gate stack (50, 55, 56, 58), and the first drain extension region 42' is located on the other side of the first gate stack (50, 55, 56, 58). The first source and drain extension regions (42, 42') have a doping of the second conductivity type, which is the opposite type of the doping type of the first top semiconductor portion 40' having a doping of the first conductivity type. The first source and drain extension regions (42, 42') are formed self-aligned to the sidewalls of the first gate stack (50, 55, 56, 58), and underlies and abuts peripheral portions of the gate dielectric portion 50 in the first gate stack (50, 55, 56, 58). In one embodiment, the first conductivity type is n-type, and the second conductivity type is p-type.

Likewise, the second source extension region 32 is located on one side of the second gate stack (50, 52, 54, 56, 58), and the second drain extension region 32' is located on the other side of the second gate stack (50, 52, 54, 56, 58). The second source and drain extension regions (32, 32') have a doping of the first conductivity type, which is the opposite type of the doping type of the second top semiconductor portion 30' having a doping of the second conductivity type. The second source and drain extension regions (32, 32') are formed self-aligned to the sidewalls of the second gate stack (50, 52, 54, 56, 58), and underlies and abuts peripheral portions of the gate dielectric portion 50 in the second gate stack (50, 52, 54, 56, 58).

First dielectric spacers 60 and second dielectric spacers 62 are formed on the sidewalls of the first gate stack (50, 55, 56, 58) in the first device region 100 and the second gate stack (50, 52, 54, 56, 58) in the second device region 200 by conformal deposition of dielectric layers and at least one anisotropic ion etch. For example, a first dielectric layer comprising a first dielectric material such as silicon oxide is formed directly on the first gate stack (50, 55, 56, 58), the second gate stack (50, 52, 54, 56, 58), and the exposed top surfaces of the top semiconductor layer 28 by a conformal deposition method such as low pressure chemical vapor deposition (LPCVD). The thickness of the first dielectric layer may be from about 5 nm to about 30 nm, although lesser and greater thicknesses are contemplated herein. A second dielectric layer comprising a second dielectric material such as silicon nitride is formed directly on the first dielectric layer by a conformal deposition method. The thickness of the second dielectric layer may be from about 10 nm to about 80 nm, although lesser and greater thicknesses are contemplated herein. The at least one anisotropic etch removed horizontal portions of the first and second dielectric layers, thereby forming the first dielectric spacers 60 and second dielectric spacers 62.

Figure 6:
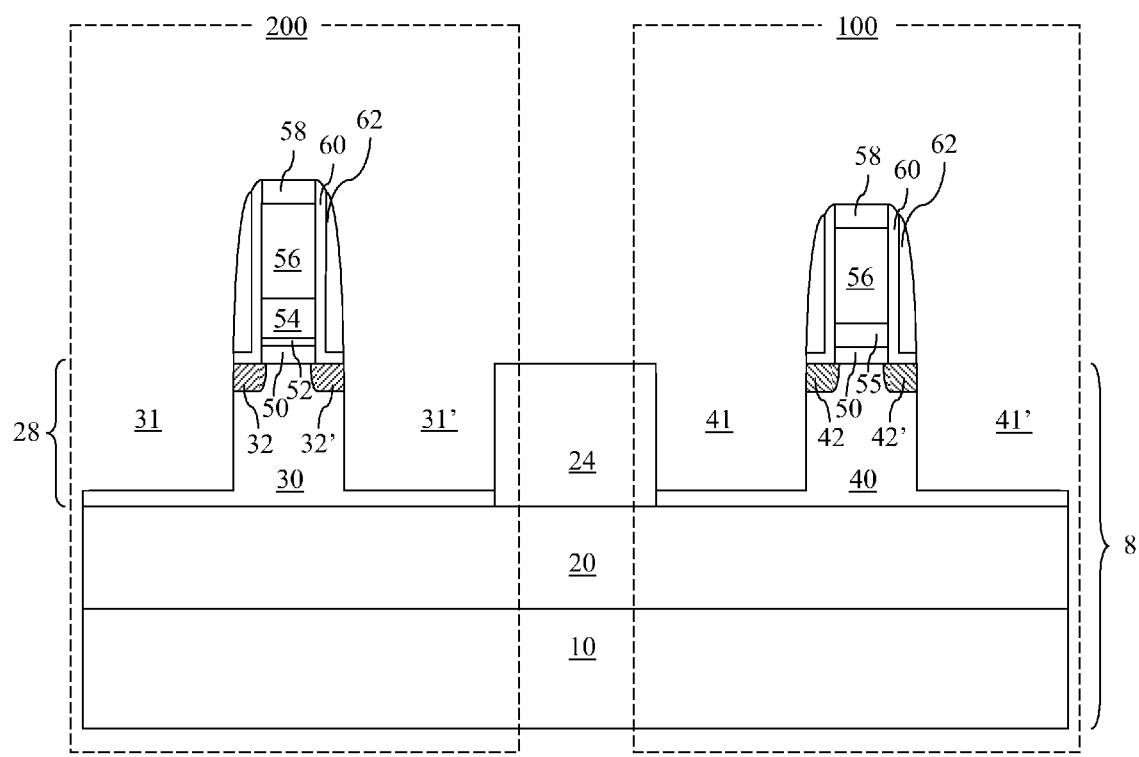

Referring to FIG. 6, the semiconductor material of the first and second top semiconductor portions (40', 30'), i.e., the single crystalline silicon-germanium alloy having the first atomic concentration of germanium, is removed by an anisotropic etch selective to the dielectric materials of the dielectric gate cap 58, the first dielectric spacers 60, the second dielectric spacers 62, and the shallow trench isolation structure 24. First trenches, which include a first source-side trench 41 and a first drain-side trench 41', are formed between the first gate stack (50, 55, 56, 58) and the shallow trench isolation structure 24 in the first device region 100, and second trenches, which include a second source-side trench 31 and a second drain-side trench 31', are formed between the second gate stack (50, 52, 54, 56, 58) and the shallow trench isolation structure 24 in the second device region 200.

The remaining portion of the first top semiconductor portion 40' is herein referred to as a first channel-containing body portion 40 since this portion includes a channel located directly underneath the gate dielectric portion 50 of the first gate stack (50, 55, 56, 58) and between the first source and drain extension regions (42, 42'). The first channel-containing body portion 40 has a doping of the first conductivity type, and functions as a portion of a body region of the first field effect transistor to be subsequently formed. The remaining portion of the second top semiconductor portion 30' is herein referred to as a second channel-containing body portion 30 since this portion includes a channel located directly underneath the gate dielectric portion 50 of the second gate stack (50, 52, 54, 56, 58) and between the second source and drain extension regions (32, 32'). The first channel-containing body portion 30 has a doping of the second conductivity type, and functions as a portion of a body region of the second field effect transistor to be subsequently formed. Each of the first and second channel-containing body portions (40, 30) includes a single crystalline silicon-germanium alloy having the first atomic concentration of germanium.

Preferably, the depth of the first trenches (41, 41') and the second trenches (31, 31') is less than the thickness of the top semiconductor layer 28 so that the single crystalline silicon-germanium alloy is present at the bottom surfaces of the first and second trenches (41, (31, 31')). The sidewalls of the first and second trenches (41, (31, 31')) may be substantially vertical since the anisotropic etch is directional. The bottom surfaces of the first and second trenches (41, (31, 31')) may be substantially planar, i.e., horizontal, since the etch rate of the single crystalline silicon-germanium alloy in the first and second channel-containing body portions (40, 30) is substantially the same irrespective of the lateral position.

Figure 7:
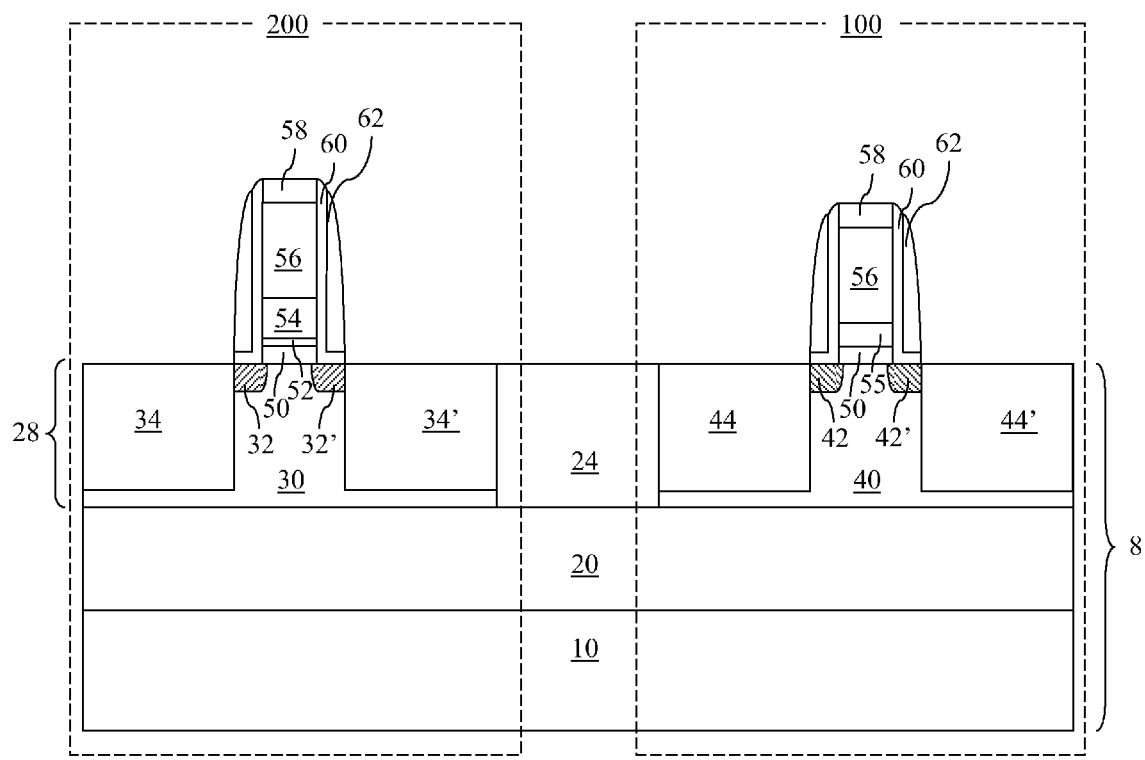

Referring to FIG. 7, silicon is epitaxially grown in the exposed surfaces of the single crystalline silicon-germanium alloy, i.e., the sidewalls and the bottom surfaces of the first trenches (41, 41') and the second trenches (31, 31'). Preferably, selective epitaxy of silicon is employed to deposit silicon on the exposed surfaces of the single crystalline silicon-germanium alloy, while preventing growth of silicon on the dielectric surfaces, which include the surfaces of the dielectric gate caps 57, the first dielectric spacer 60, the second dielectric spacer 62, and the shallow trench isolation structure 24.

The silicon material deposited in the first source-side trench 41 in the first device region 100 constitutes a first source-side embedded silicon regions 44, and the silicon material deposited in the first drain-side trench 41' in the first device region 100 constitutes a first drain-side embedded silicon regions 44'. The silicon material deposited in the second source-side trench 31 in the second device region 200 constitutes a second source-side embedded silicon regions 34, and the silicon material deposited in the second drain-side trench 31' in the second device region 200 constitutes a second drain-side embedded silicon regions 34'. The first source-side embedded silicon region 44 abuts the first source extension region 42, and the first drain-side embedded silicon region 44' abuts the first drain extension region 42'. The second source-side embedded silicon region 34 abuts the second source extension region 32, and the second drain-side embedded silicon region 34' abuts the second drain extension region 32'.

Preferably, the first embedded silicon regions (44, 44') and the second embedded silicon regions (34, 34') are formed without doping, i.e., substantially free of electrical dopants such as boron, gallium, indium, phosphorus, arsenic, or antimony. In this case, the atomic concentration of the dopant atoms, which may be introduced into the first embedded silicon regions (44, 44') and the second embedded silicon regions (34, 34') by autodoping during the selective epitaxy process is less than about $1.0 \times 10^{16}/cm^3$, and preferably less than about $1.0 \times 10^{15}/cm^3$, and more preferably less than $1.0 \times 10^{14}/cm^3$. Thus, the first embedded silicon regions (44, 44') and the second embedded silicon regions (34, 34') are substantially intrinsic, i.e., not doped with electrical dopants. In other words, the first embedded silicon regions (44, 44') and the second embedded silicon regions (34, 34') essentially consist of epitaxial silicon, and are substantially free of electrical dopants. The first embedded silicon regions (44, 44') and the second embedded silicon regions (34, 34') include intrinsic epitaxial silicon. Specifically, the first embedded silicon regions (44, 44') and the second embedded silicon regions (34, 34') consist of intrinsic epitaxial silicon and are substantially free of germanium or any other atomic element than silicon.

Since the first embedded silicon regions (44, 44') and the second embedded silicon regions (34, 34') are epitaxially aligned with the first or second channel-containing body portion (40 or 30) and the lattice constant of silicon is less than the lattice constant of the single crystalline silicon-germanium alloy in the first embedded silicon regions (44, 44') and the second embedded silicon regions (34, 34'), the first embedded silicon regions (44, 44') apply a longitudinal tensile stress along the direction of the channel between the first source and drain regions (42, 42'), and the second embedded silicon regions (34, 34') apply a longitudinal tensile stress along the direction of the channel between the second source and drain regions (32, 32').

Figure 8:
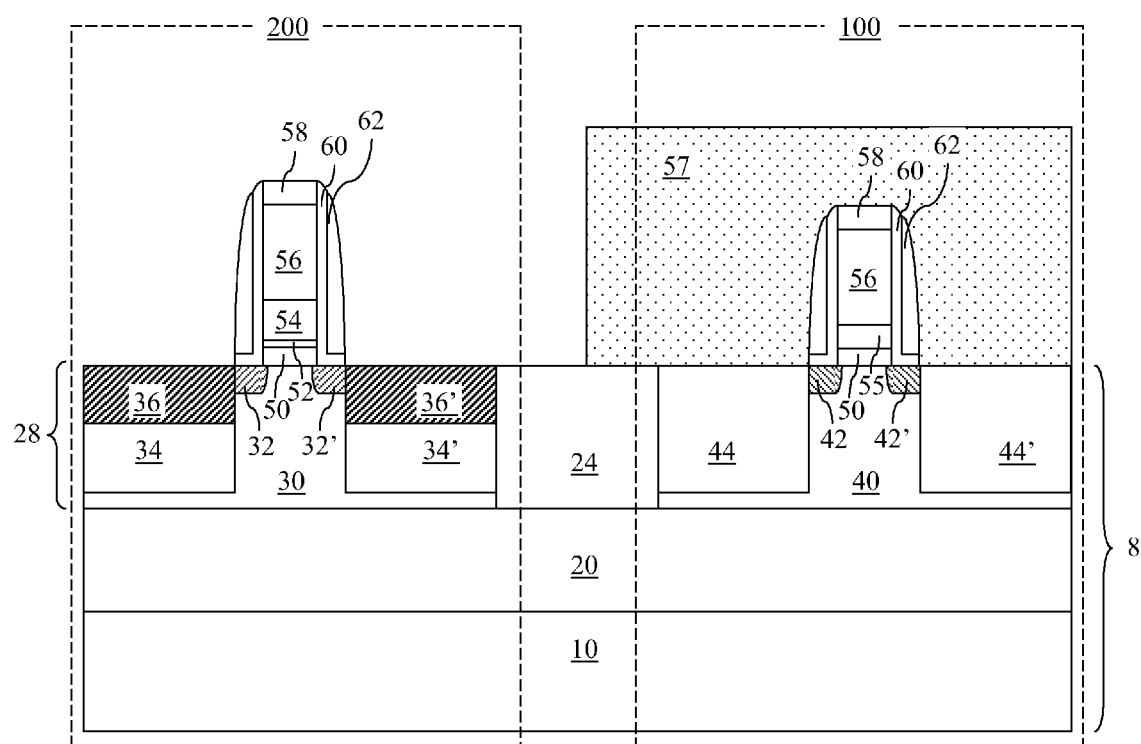

Referring to FIG. 8, a second block level photoresist 57 may be applied over the first gate stack (50, 55, 56, 58), the second gate stack (50, 52, 54, 56, 58), and the top semiconductor layer 28 and lithographically patterned to cover the first device region 100, while exposing the second device region 200. An upper source region 36 having a doping of the first conductivity type may be formed by implanting dopants of the first conductivity type into an upper portion of the second source-side embedded silicon region 34. Likewise, an upper drain region 36' having a doping of the first conductivity type may be formed by implanting dopants of the first conductivity type into an upper portion of the second drain-side embedded silicon region 34'. The implanted portions of the second embedded silicon regions (34, 34') become the upper source and drain regions (36, 36'), which laterally abut the second source and drain extension regions (32, 32'). Preferably, the depth of the ion implantation is less than the depth of the second embedded silicon regions (34, 34'), so that a portion of the second embedded silicon regions (34, 34') is present underneath each of the upper source and drain regions (36, 36') after the ion implantation. The second block level photoresist 57 is subsequently removed. The step in FIG. 8 is optional, and may be omitted in some embodiments.

Figure 9:
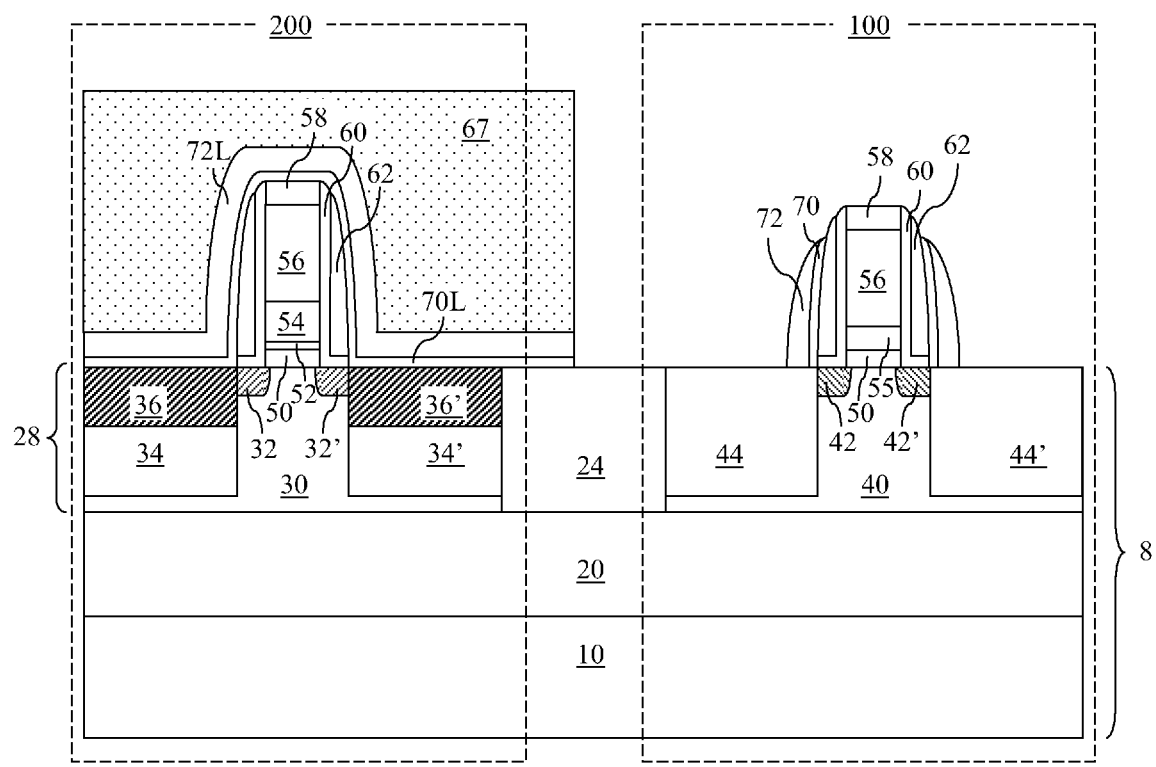

Referring to FIG. 9, a third dielectric layer 70L and a fourth dielectric layer 72L are formed on the exposed surfaces of the first gate stack (50, 55, 56, 58), the second gate stack (50, 52, 54, 56, 58), and the top semiconductor layer 28 by conformal deposition methods such as low pressure chemical vapor deposition (LPCVD) or plasma enhanced chemical vapor deposition (PECVD). A third block level photoresist 67 is applied over the fourth dielectric layer 72L and lithographically patterned to cover the second device region 200, while exposing the first device region 100. At least one anisotropic etch is employed to etch horizontal portions of the third dielectric layer 70L and the fourth dielectric layer 72L in the first device region 100. The remaining portion of the third dielectric layer 70L in the first device region 100 constitutes a third dielectric spacer 70, and a remaining portion of the fourth dielectric layer 72L in the first device region 100 constitutes a fourth dielectric spacer 72.

The third dielectric layer 70L includes a third dielectric material such as silicon oxide and/or silicon oxynitride. The thickness of the third dielectric layer 70L may be from about 2 nm to about 30 nm, although lesser and greater thicknesses are contemplated herein. The fourth dielectric layer 72L includes a fourth dielectric material such as silicon nitride. The thickness of the fourth dielectric layer may be from about 5 nm to about 80 nm, although lesser and greater thicknesses are contemplated herein. The third block level photoresist 67 may be removed after formation of the third and fourth dielectric spacers (70, 72), or may be removed at a later processing step.

Figure 10:
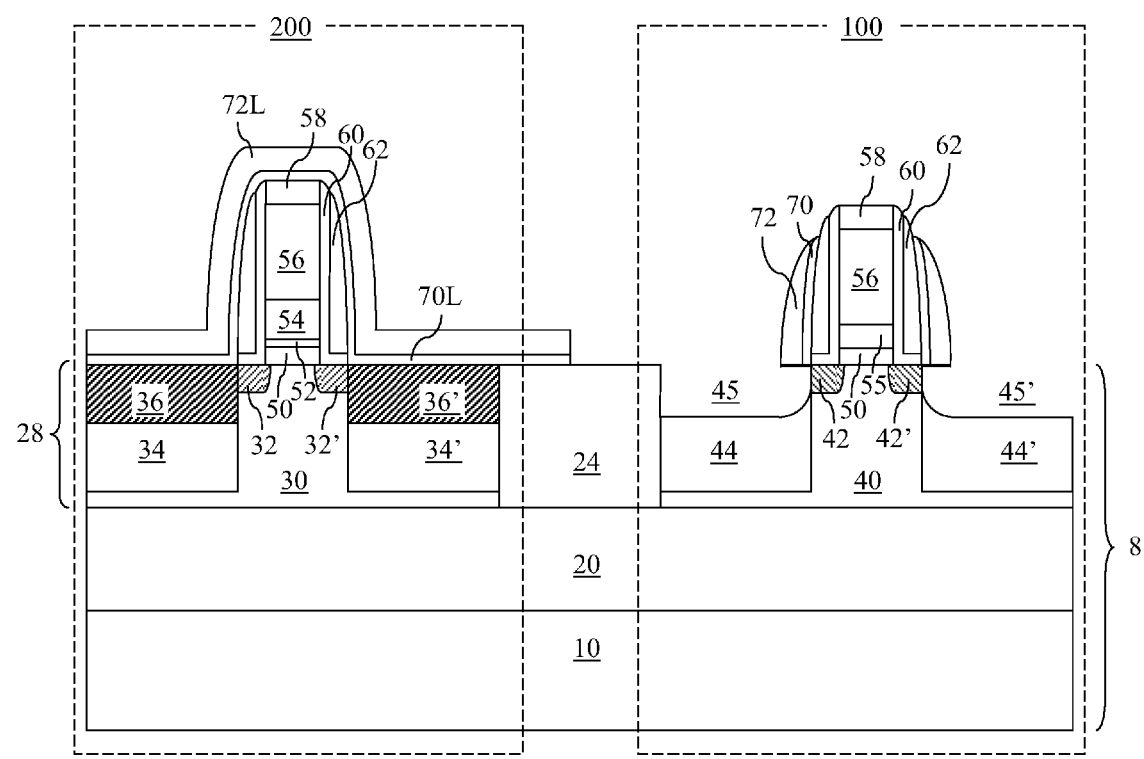

Referring to FIG. 10, the exposed portions of the first embedded silicon regions (44, 44') are etched by a substantially isotropic etch, which may be a dry etch such as a chemical downstream etch (CDE) or a wet etch. The substantially isotropic etch is selective to the dielectric materials of the dielectric gate cap 58, the first dielectric spacers 60, the second dielectric spacers 62, the third dielectric spacer 70, the fourth dielectric spacer 72, and the shallow trench isolation structure 24. If the third block level photoresist 67 is present at this step, the substantially isotropic etch may, or may not, be selective to the third block level photoresist 7. Not necessarily but preferably, the substantially isotropic etch removes silicon selective to a silicon-germanium alloy, i.e., removes the material of the first embedded silicon regions (44, 44'), while not removing the material of the first channel-containing body portion 40 or the material of the first source and drain extension regions (42, 42').

The isotropic etch forms a third source-side trench 45 above a remaining portions of the first source-side embedded silicon region 44 and a third drain-side trench 45' above a remaining portions of the first drain-side embedded silicon region 44'. The isotropic etch undercuts the third dielectric spacer 70 and the fourth dielectric spacer 72. The bottom surfaces of the third dielectric spacer 70 and the fourth dielectric spacer 72 are exposed above the third trenches (45, 45'). Each remaining portions of the first embedded silicon regions (44, 44') includes a concave surface directly adjoined to a substantially vertical sidewall of the first embedded silicon regions (44, 44'), which abuts the first channel-containing body portion 40. Each of the third trenches (45, 45') includes a convex surface that is adjoined to the substantially vertical sidewall of one of the first embedded silicon regions (44, 44'). The depth of planar portions of the third trenches (45, 45') from the bottom surface of the gate dielectric portion 50 in the first device region 100 is about the sum of the thicknesses of the third and fourth insulator layers (70L, 72L), and may be from about 7 nm to about 110 nm, and typically from about 15 nm to about 60 nm, although lesser and greater thicknesses are also contemplated herein.

Figure 11:
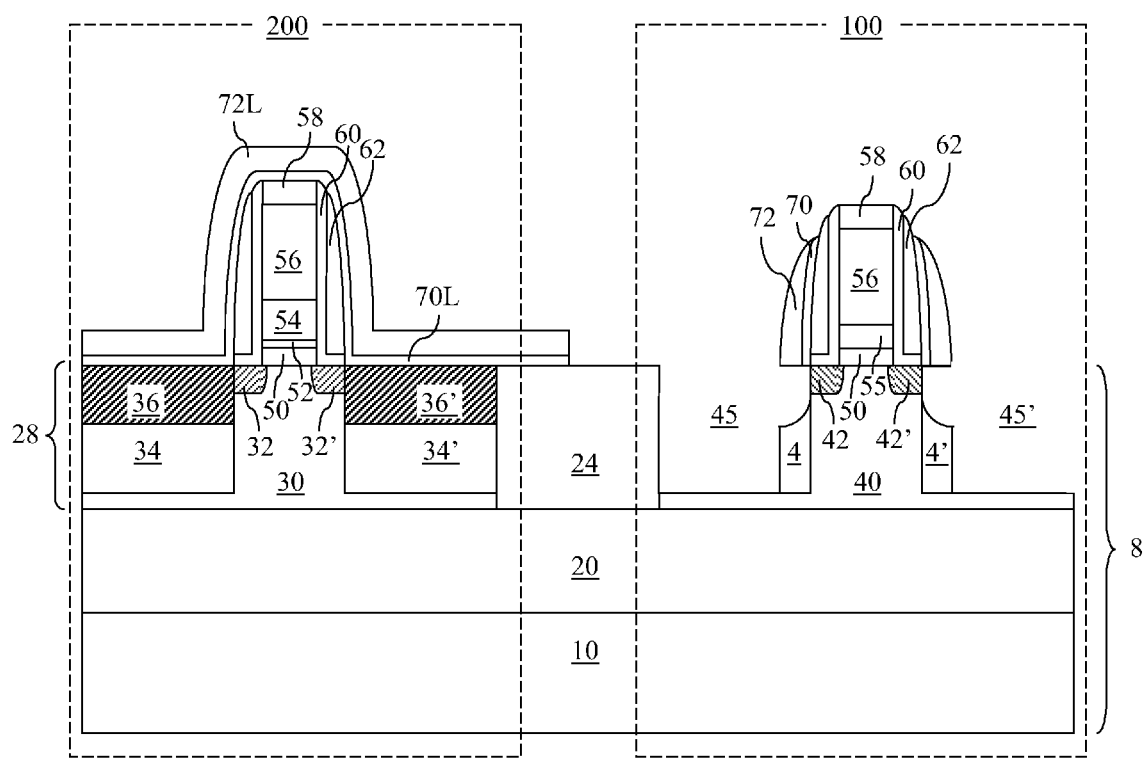

Referring to FIG. 11, an anisotropic etch is performed to remove portions of the first embedded silicon regions (44, 44') that are not shaded by the dielectric materials of the dielectric gate cap 58, the first dielectric spacers 60, the second dielectric spacers 62, the third dielectric spacer 70, the fourth dielectric spacer 72, the fourth dielectric layer 72L, and the shallow trench isolation structure 24. The dielectric materials function as an etch mask for the anisotropic etch. Preferably, the anisotropic etch is highly directional to minimize etching of the portions of the first embedded silicon regions (44, 44') underlying the third and fourth dielectric spacers (70, 72). Preferably, a reactive ion etch (RIE) is employed, in which the direction of etch gases impinging on the first embedded silicon regions (44, 44') is substantially perpendicular to the top surface of the top semiconductor layer 28.

The depth of the third trenches (45, 45') is extended. In one embodiment, the anisotropic etch is selective to the single crystalline silicon-germanium alloy material in the first channel-containing body portion 40, and the bottom surface of the third trenches (45, 45') may be substantially coplanar with the bottom surface of the remaining portions of the first embedded silicon regions (44, 44'), which are herein referred to as a first source-side body portion 4 and a first drain-side body portion 4'. Each of the first source-side body portion 4 and the first drain-side body portion includes a concave upper surface and a pair of substantially vertical sidewalls, one of which abuts the first channel-containing body portion 40.

The first channel-containing body portion 40, the first source-side body portion 4, and the first drain-side body portion 4' collectively constitute a body region of the first field effect transistor to be subsequently formed. The first channel-containing body portion 40 includes a single crystalline silicon-germanium alloy having the first atomic concentration of germanium. The first source-side body portion 4 and the first drain-side body portion 4' include intrinsic single crystalline silicon that is substantially free of germanium and any other material than silicon, and are epitaxially aligned to the first channel-containing body portion 40.

Each of the third source-side trench 45 and the third drain-side trench 45' has a laterally protruding portion that is adjoined to a substantially vertical sidewall underneath, which is an outer sidewall of the first source-side body portion 4 or the first drain-side body portion 4'. Due to the removal of a substantial portion of the material from the first embedded silicon regions (44, 44'), which leaves only the first source-side body portion 4 and the first drain-side body portion 4' in the first device region, the longitudinal tensile stress along the direction of the channel between the first source and drain regions (42, 42') is substantially reduced.

Figure 12:
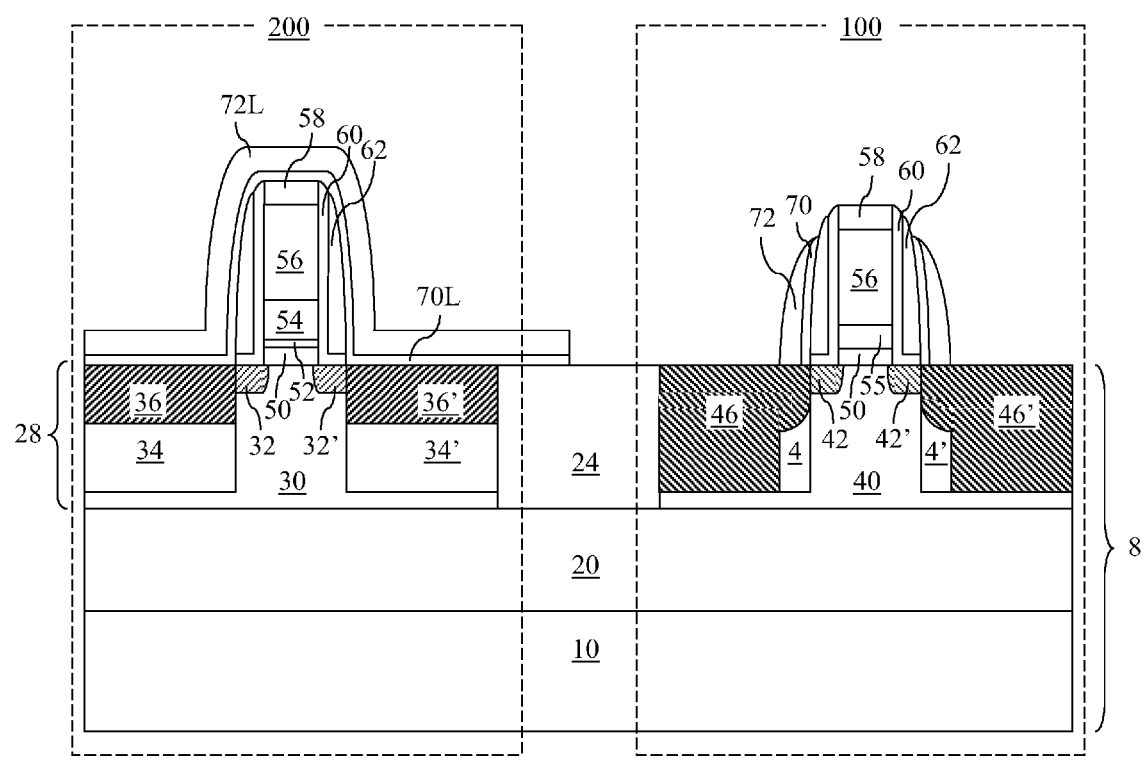

Referring to FIG. 12, a silicon-geranium alloy material having a second atomic concentration of germanium is epitaxially formed on the exposed semiconductor surfaces, which include exposed surfaces of the first channel-containing body portion 40, the first source-side body portion 4, the first drain-side body portion 4', and the first source and drain extension regions (42, 42'). The third trenches (45, 45') are filled with the silicon-germanium alloy material. Preferably, deposition of the of the silicon-geranium alloy material so that deposition of the material occurs only on semiconductor surfaces, while no deposition occurs on dielectric surfaces.

A source-side embedded silicon-germanium alloy region 46 fills the third source-side trench 45, and a drain-side embedded silicon-germanium alloy region 46' fills the third drain-side trench 45'. The embedded silicon-germanium alloy region (46, 46') are formed in epitaxial alignment with the first channel-containing body portion 40, the first source-side body portion 4, the first drain-side body portion 4', and the first source and drain extension regions (42, 42'). Thus, the entirety of the embedded silicon-germanium alloy region (46, 46'), the first channel-containing body portion 40, the first source-side body portion 4, the first drain-side body portion 4', and the first source and drain extension regions (42, 42') is single crystalline.

The second atomic concentration of germanium is greater than the first atomic concentration. The second atomic concentration may be from about 5% to about 50%, and preferably from about 15% to about 45%, and more preferably from about 25% to about 40%, although lesser and greater second atomic concentrations are also contemplated herein. Since the second atomic concentration of germanium is greater than the first atomic concentration of germanium and the atomic size of germanium is greater than the atomic size of silicon, the embedded silicon-germanium alloy region (46, 46') applies a longitudinal compressive stress to the channel between the first source and drain extension regions (42, 42') along the direction of the channel, i.e., the direction connecting the source-side embedded silicon-germanium alloy region 46 and the drain-side embedded silicon-germanium alloy region 46'.

Preferably, the source-side embedded silicon-germanium alloy region 46 and the drain-side embedded silicon-germanium alloy region 46' are in-situ doped with dopants of the second conductivity type at a doping concentration from about $5.0\times10^{19}/cm^3$ to about $1.0\times10^{21}/cm^3$, and typically from about $1.0\times10^{20}/cm^3$ to about $5.0\times10^{20}/cm^3$ to provide low resistivity as a first source region and a first drain region, respectively, of the first field effect transistor in the first device region.

Figure 13:
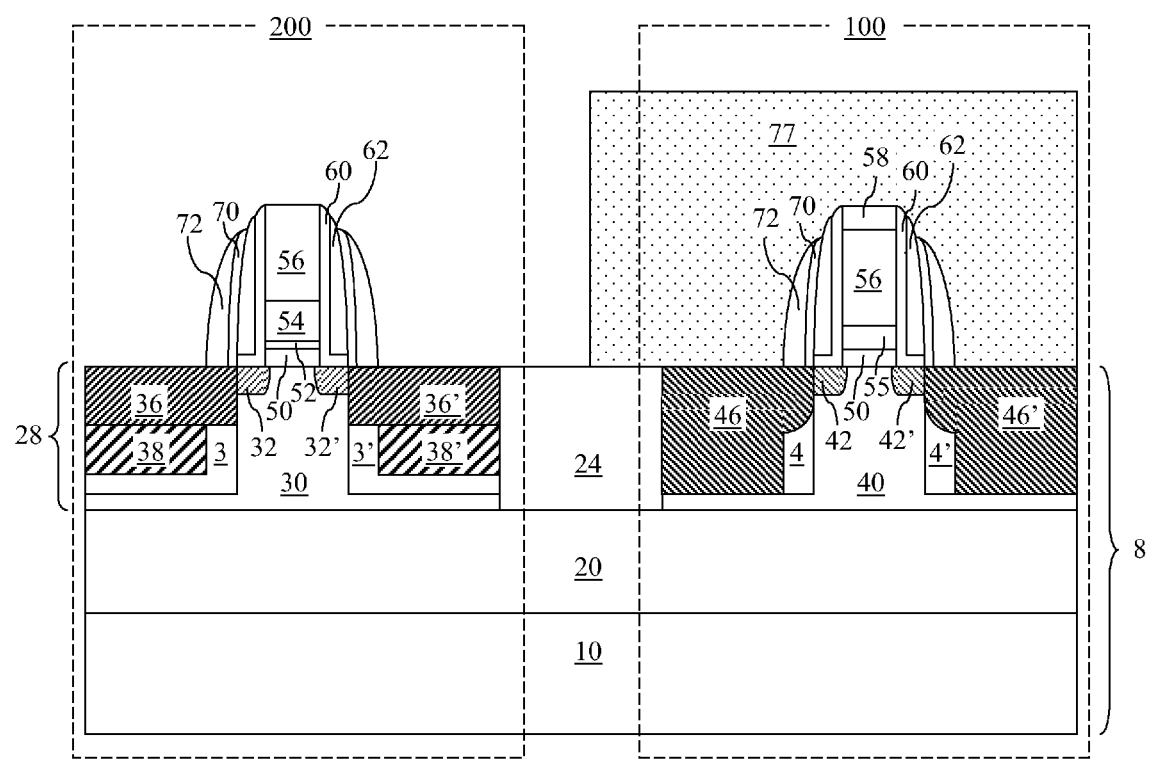

Referring to FIG. 13, a fourth block level photoresist 77 is applied over the top surfaces of the first gate stack (50, 55, 56, 58), the fourth dielectric layer 72L (See FIG. 12), and the top semiconductor layer 28, and is lithographically patterned to expose the second device region 200, while the first device region 100 is covered with the fourth block level photoresist 77. An anisotropic etch is employed to remove horizontal portions of the fourth dielectric layer 72L and the third dielectric layer 70L. The dielectric gate cap 58 in the second device region is removed at this step. Preferably, the anisotropic etch removes dielectric materials of the fourth dielectric layer 72L, the third dielectric layer 70L, and the dielectric gate cap 58 selective to the semiconductor material of the upper source region 36 and the upper drain region 36', i.e., single crystalline silicon material having a doping of the first conductivity type. The remaining portion of the fourth dielectric layer 72L in the second device region 200 constitutes another fourth dielectric spacer 72, and the remaining portion of the third dielectric layer 70L in the second device region 200 constitutes another third dielectric layer 70. The lateral thickness of the third dielectric spacers 70 may be substantially the same as the thickness of the third dielectric layer 70L, and the lateral thickness of the fourth dielectric spacers 72 may be substantially the same as the thickness of the fourth dielectric layer 72L. The fourth block level photoresist 77 is subsequently removed.

The structures above the top surface of the top semiconductor layer 28, which include the second gate stack (50, 52, 54, 56, 58), the first through fourth dielectric spacer (60, 62, 70, 72) in the second device region 200, and the fourth block level photoresist 77, are employed as an implantation mask in a subsequent ion implantation of dopants of the first conductivity type into upper portions of the second embedded silicon regions (34, 34'). A lower source region 38 having a doping of the first conductivity type is formed directly underneath the upper source region 36, and a lower drain region 38' having a doping of the first conductivity type is formed directly underneath the upper drain region 36'.

The upper source region 36 and the lower source region 38 collectively constitute a second source region (36, 38), which functions as a source region of the second field effect transistor in the second device region 200. The upper drain region 36' and the lower drain region 38' collectively constitute a second drain region (36', 38'), which functions as a drain region of the second field effect transistor in the second device region 200.

The remaining unimplanted portion of the second source-side embedded silicon region 34 is herein referred to as a second source-side body portion 3, and the remaining unimplanted portion of the second drain-side embedded silicon region 34' is herein referred to as a second drain-side body portion 3'. The second source-side body portion 3 and the second drain-side body portion include intrinsic epitaxial silicon, and are substantially free of germanium. Typically, the second source-side body portion 3 and the second drain-side body portion include intrinsic consists essentially of silicon, with trace amounts of other elements if any.

Figure 14:
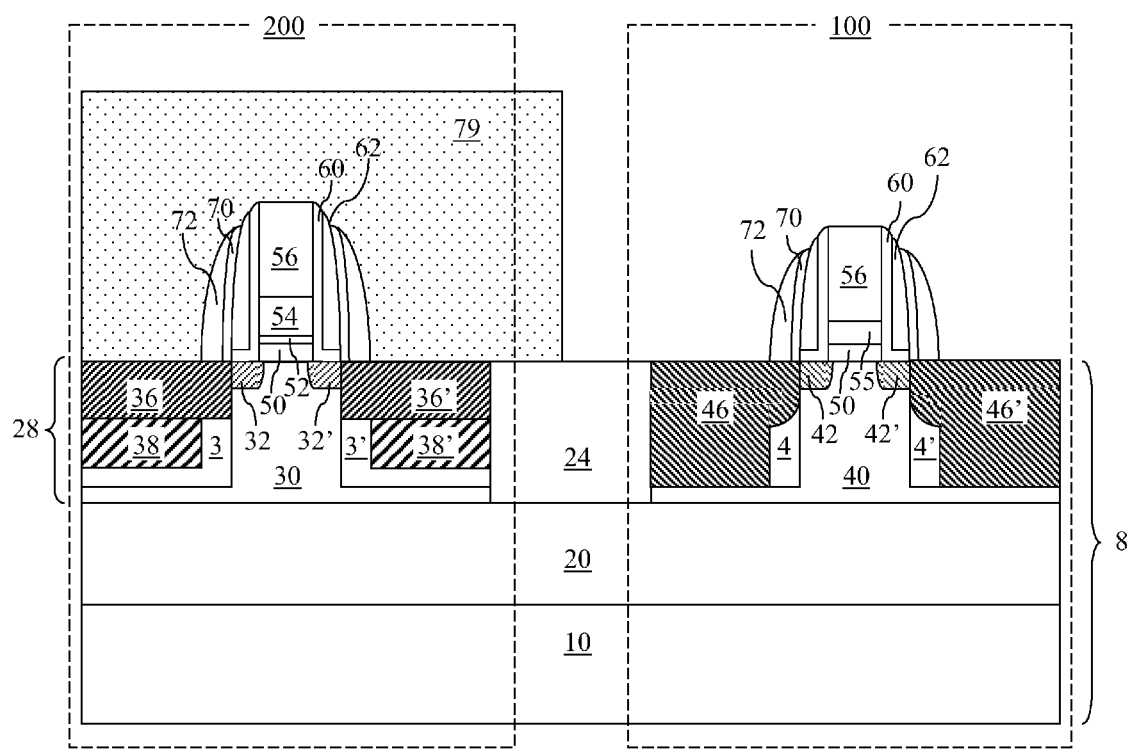

Referring to FIG. 14, a fifth block level photoresist 79 is applied over the exemplary semiconductor structure, and is lithographically patterned to expose the first device region 100, while covering the second device region 200. An etch is employed to remove the dielectric gate cap 58 from the first device region 100. The etch is preferably selective to the embedded silicon-germanium alloy region (46, 46'). The etch may be an anisotropic etch such as a reactive ion etch, or an isotropic etch such as a wet etch. After removal of the dielectric gate cap 58, the fifth block level photoresist 79 is removed.

Figure 15:
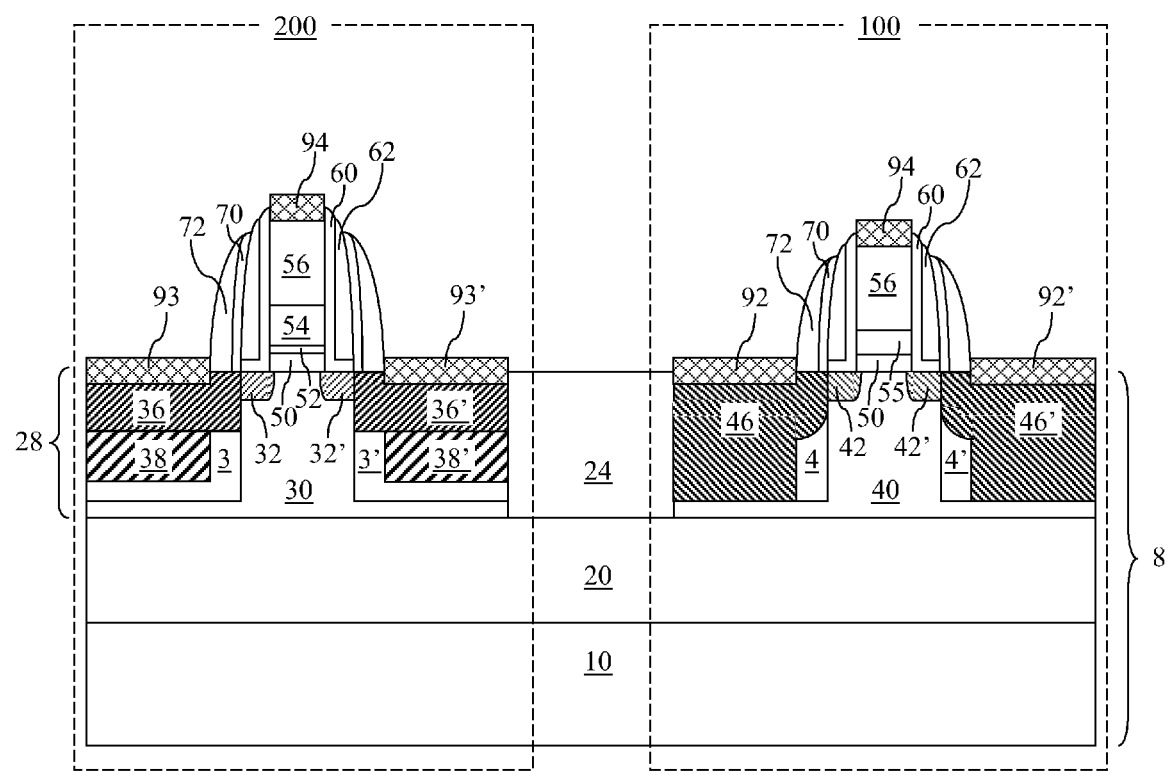

Referring to FIG. 15, various metal semiconductor alloy regions, such as metal silicide regions, may be formed on exposed semiconductor surfaces by depositing a metal layer (not shown) over the exemplary semiconductor structure and inducing reaction of the metal layer with the exposed semiconductor material during an anneal at an elevated temperature. The unreacted portions of the metal layer are subsequently removed selective to the metal semiconductor alloy regions and dielectric materials. The various metal semiconductor alloy regions may include a first source-side metal semiconductor alloy region 92, a first drain-side metal semiconductor alloy region 92', a second source-side metal semiconductor alloy region 93, and a second drain-side metal semiconductor alloy region 93'. The first source-side metal semiconductor alloy region 92 is formed directly on the source-side embedded silicon-germanium alloy region 46, the first drain-side metal semiconductor alloy region 92' is formed directly on the drain-side embedded silicon-germanium alloy region 46', the second source-side metal semiconductor alloy region 93 is formed directly on the second source region (36, 38), and the second drain-side metal semiconductor alloy region 93' is formed directly on the second drain region (36', 38'). Further, gate metal semiconductor alloy regions 94 may be formed directly on the gate semiconductor portions 56. The thickness of the various metal semiconductor alloy regions may be from about 5 nm to bout 50 nm, and typically from about 10 nm to about 25 nm, although lesser and greater thicknesses are also contemplated herein.

The first source-side metal semiconductor alloy region 92 and the first drain-side metal semiconductor alloy region 92' include a metal germano-silicide, which contains silicon, germanium, at least one metal that is supplied from the metal layer, and electrical dopants of the second conductivity type. The metal layer may include at least one transition metal, non-limiting examples of which include W, Co, Ta, Ti, Ni, Pt, Os, etc. The second source-side metal semiconductor alloy region 93 and the second drain-side metal semiconductor alloy region 93' include a metal silicide, which contains silicon, the at least one metal supplied from the metal layer, and electrical dopants of the first conductivity type.

Figure 16:
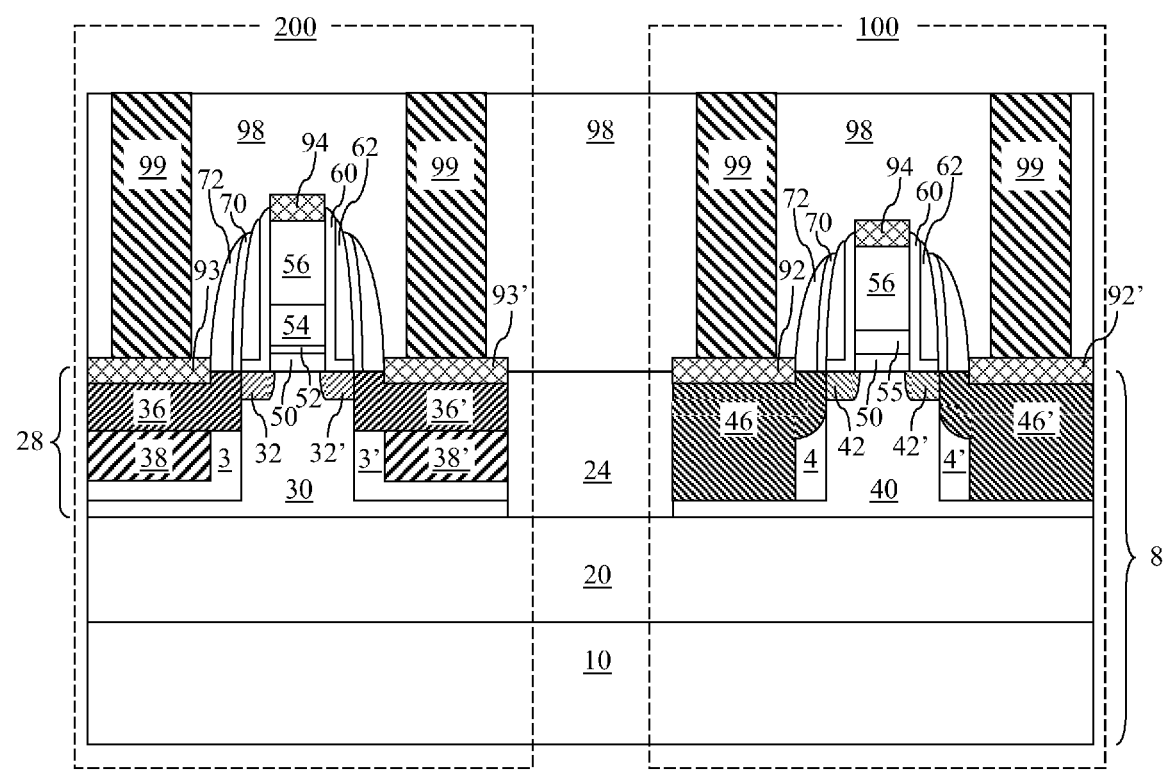

Referring to FIG. 16, a middle-of-line (MOL) dielectric layer 98 is formed over the exemplary semiconductor structure, i.e., on the various metal semiconductor alloy regions (92, 92', 93, 93', 94), the shallow trench isolation structure 24, and the first through fourth dielectric spacers (60, 62, 70, 72). The MOL dielectric layer 98 may include, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer 98 may be from about 200 nm to about 500 nm. Alternately, the MOL dielectric layer 98 may include an organosilicate glass (OSG) having a dielectric constant value of less than 2.8. The MOL dielectric layer 98 is preferably planarized, for example, by chemical mechanical polishing (CMP). Alternately, the MOL dielectric layer may be a self-planarizing material such as a spin-on glass (SOG) or a spin-on low-k dielectric material such as SiLK™.

Various contact via holes are formed in the MOL dielectric layer 98 and filled with metal to from various contact vias 99. The formation of the various contact via holes may be effected by applying a photoresist (not shown) over the MOL dielectric layer 98 and lithographically patterning the photoresist to form a pattern of via holes. The pattern of the via holes is transferred into the MOL dielectric layer by an anisotropic etch, which is preferably selective to the various metal semiconductor alloy portions to accommodate the differences in the height of the via holes to be formed in the MOL dielectric layer 98. A conductive material such as doped polysilicon or a metal is deposited into the via holes, for example, by chemical vapor deposition (CVD). Excess conductive material over the top surface of the MOL dielectric layer 98 is removed by a recess etch, a planarization process, or a combination thereof to form the various contact vias.

The first field effect transistor in the first device region 100 includes a first source region which includes the source-side embedded silicon-germanium alloy region 46 having a doping of the second conductivity type and comprising a silicon-germanium alloy having the second atomic concentration of germanium; a first drain region which includes the drain-side embedded silicon-germanium alloy region 46' a doping of the second conductivity type and comprising a silicon-germanium alloy having the second atomic concentration of germanium; a first body region (40, 4, 4') including the first channel-containing body portion 40 having a doping of the first conductivity type and comprising a silicon-germanium alloy having the first atomic concentration of germanium and including the first channel, the first source-side body portion 4 comprising intrinsic epitaxial silicon and being substantially free of germanium, and the first drain-side body region 4' comprising intrinsic epitaxial silicon and being substantially free of germanium; a first gate dielectric 50, i.e., the gate dielectric portion 50 in the first device region 100, vertically abutting the first channel, which is located between the first source and drain extension regions (42, 42'); and a first gate electrode (55, 56, 94), i.e., the stack of the first metal gate portion 55, the gate semiconductor portion 56 in the first device region 100, and the gate metal semiconductor alloy region 94 in the first device region 100.

Further, the first device region 100 includes a first source-side p-n junction along the boundary between the first channel-containing body portion 40 and the first source extension region 42. The first source-side p-n junction extends along the boundary between the first channel-containing body portion 40 and the source-side embedded silicon-germanium alloy region 46. The first source-side p-n junction further extends into the first source-side body portion 4 since the first source-side body portion 4 is substantially intrinsic. Thus, the p-n junction within the first source-side body portion 4 is located between the two substantially vertical sidewalls of the first source-side body portion 4 that laterally abut the first channel-containing body portion 40 or the source-side embedded silicon-germanium alloy region 46. The presence of this portion of the first source-side p-n junction within the volume of the first source-side body portion 4 reduces a junction leakage current since this portion of the p-n junction is located within a substantially intrinsic semiconductor material. The first source-side p-n junction further extends along a substantially horizontal boundary between the source-side embedded silicon-germanium alloy region 46 and the first channel-containing body portion 40 and terminates at a sidewall of the shallow trench isolation structure 24.

Yet further, the first device region 100 includes a first drain-side p-n junction along the boundary between the first channel-containing body portion 40 and the first drain extension region 42'. The first drain-side p-n junction extends along the boundary between the first channel-containing body portion 40 and the drain-side embedded silicon-germanium alloy region 46'. The first drain-side p-n junction further extends into the first drain-side body portion 4' since the first drain-side body portion 4' is substantially intrinsic. Thus, the p-n junction within the first drain-side body portion 4' is located between the two substantially vertical sidewalls of the first drain-side body portion 4' that laterally abut the first channel-containing body portion 40 or the drain-side embedded silicon-germanium alloy region 46'. The presence of this portion of the first drain-side p-n junction within the volume of the first drain-side body portion 4' reduces a junction leakage current since this portion of the p-n junction is located within a substantially intrinsic semiconductor material. The first drain-side p-n junction further extends along a substantially horizontal boundary between the drain-side embedded silicon-germanium alloy region 46' and the first channel-containing body portion 40 and may terminate at a sidewall of another shallow trench isolation structure (not shown).

The second field effect transistor in the second device region 200 includes a second source region (36, 38) having a doping of the first conductivity type and comprising a germanium-free single crystalline silicon; a second drain region (36', 38') having a doping of the first conductivity type and comprising a germanium-free single crystalline silicon; a second body region (30, 3, 3') including the second channel-containing body portion 30 having a doping of the second conductivity type and comprising a silicon-germanium alloy having the first atomic concentration of germanium and including the second channel, the second source-side body portion 3 comprising intrinsic epitaxial silicon and being substantially free of germanium, and the second drain-side body region 3' comprising intrinsic epitaxial silicon and being substantially free of germanium; a second gate dielectric (50, 52), i.e., the stack of the gate dielectric portion 50 in the first device region 100 and the threshold voltage adjustment dielectric portion 52, vertically abutting the second channel, which is located between the second source and drain extension regions (32, 32'); and a second gate electrode (54, 56, 94), i.e., the stack of the second metal gate portion 54, the gate semiconductor portion 56 in the second device region 200, and the gate metal semiconductor alloy region 94 in the first device region 200.

Further, the second device region 200 includes a second source-side p-n junction along the boundary between the second channel-containing body portion 30 and the second source extension region 32. The second source-side p-n junction extends along the boundary between the second channel-containing body portion 30 and the upper source region 36. The second source-side p-n junction further extends into the second source-side body portion 3 since the second source-side body portion 3 is substantially intrinsic. Thus, the p-n junction within the second source-side body portion 3 is located between the second channel-containing body portion 30 and the lower source region 38. The presence of this portion of the second source-side p-n junction within the volume of the second source-side body portion 3 reduces a junction leakage current since this portion of the p-n junction is located within a substantially intrinsic semiconductor material. The second source-side p-n may terminate at a sidewall of yet another shallow trench isolation structure (not shown).

Yet further, the second device region 200 includes a second drain-side p-n junction along the boundary between the second channel-containing body portion 30 and the second drain extension region 32'. The second drain-side p-n junction extends along the boundary between the second channel-containing body portion 30 and the upper drain region 36'. The second drain-side p-n junction further extends into the second drain-side body portion 3' since the second drain-side body portion 3' is substantially intrinsic. Thus, the p-n junction within the second drain-side body portion 3' is located between the second channel-containing body portion 30' and the lower drain region 38'. The presence of this portion of the second drain-side p-n junction within the volume of the second drain-side body portion 3' reduces a junction leakage current since this portion of the p-n junction is located within a substantially intrinsic semiconductor material. The second drain-side p-n terminates at a sidewall of the shallow trench isolation structure 24.

Thus, the first field effect transistor further includes a first source-side p-n junction located within the first source-side body portion 4 and a first drain-side p-n junction located within the first drain-side body portion 4', and the second field effect transistor further includes a second source-side p-n junction located within the second source-side body portion 3 and a second drain-side p-n junction located within the second drain-side body portion 3'.

A longitudinal compressive stress is applied to the first channel in the longitudinal direction, i.e., in the direction connecting the source-side embedded silicon-germanium alloy region 46 and the drain-side embedded silicon-germanium alloy region 46' in the first field effect transistor. A longitudinal tensile stress is applied to the second channel in the longitudinal direction, i.e., in the direction connecting the second source region (36, 38) and the second drain region (36', 38'). The longitudinal compressive stress and the longitudinal transverse stress may be employed to enhance performance to two different types of field effect transistors at the same time. For example, the first conductivity type may be n-type and the second conductivity type may be p-type. In this case, the first field effect transistor is a p-type field effect transistor having a longitudinal compressive stress in the first channel, in which the hole mobility is enhanced due to the longitudinal compressive stress. This results in an increase in the on-current and other performance parameters of the first field effect transistor. Likewise, the second field effect transistor is an n-type field effect transistor having a longitudinal tensile stress in the second channel, in which the electron mobility is enhanced due to the longitudinal tensile stress. This results in an increase in the on-current and other performance parameters of the second field effect transistor. Thus, the present invention provides performance enhancement on complementary metal-oxide-semiconductor field effect transistors (CMOSFETs) including a p-type field effect transistor and an n-type field effect transistor.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising a field effect transistor located on a semiconductor substrate, wherein said field effect transistor comprises:
    a body region including a channel-containing body portion having a doping of a first conductivity type and comprising a silicon-germanium alloy having a first atomic concentration of germanium and including a channel;
    a source region having a doping of a second conductivity type and comprising a silicon-germanium alloy having a second atomic concentration of germanium, wherein said second atomic concentration is greater than said first atomic concentration, and wherein said second conductivity type is the opposite of said first conductivity type; and
    a drain region having a doping of said second conductivity type and comprising a silicon-germanium alloy having said second atomic concentration of germanium, wherein said body region further includes:
    a source-side body portion comprising intrinsic epitaxial silicon and being substantially free of germanium; and
    a drain-side body portion comprising intrinsic epitaxial silicon and being substantially free of germanium.

2. The semiconductor structure of claim 1, wherein said source region abuts and is epitaxially aligned to said source-side body portion, and wherein said drain region abuts and is epitaxially aligned to said drain-side body portion.

3. The semiconductor structure of claim 2, wherein said channel-containing body portion abuts and is epitaxially aligned to said source-side body portion and said drain-side body portion.

4. The semiconductor structure of claim 3, wherein a boundary between said channel-containing body portion and said source-side body portion includes a first substantially vertical sidewall surface and a first substantially horizontal surface, and wherein a boundary between said channel-containing body portion and said drain-side body portion includes a second substantially vertical sidewall surface and a second substantially horizontal surface.

5. The semiconductor structure of claim 4, further comprising:
    a source extension region laterally abutting said source region and abutting said channel-containing body portion and a gate dielectric, comprising a silicon-germanium alloy having said first atomic concentration of germanium, and having a doping of said second conductivity type; and
    a drain extension region laterally abutting said drain region and abutting said channel-containing body portion and said gate dielectric, comprising a silicon-germanium alloy having said first atomic concentration of germanium, and having a doping of said second conductivity type.

6. The semiconductor structure of claim 5, wherein a boundary between said source region and said source extension region is substantially vertically coincident with said first substantially vertical sidewall surface, and wherein a boundary between said drain region and said drain extension region is substantially vertically coincident with said second substantially vertical sidewall surface.

7. The semiconductor structure of claim 1, wherein said semiconductor substrate comprises:
    a bottom substrate layer comprising silicon;
    an intermediate substrate layer comprising a graded silicon-germanium alloy and vertically abutting said bottom substrate layer, wherein a concentration of germanium monotonically increases in said intermediate substrate layer with a vertical distance from an interface between said bottom substrate layer and said intermediate substrate layer; and
    a top semiconductor layer abutting a top surface of said intermediate substrate layer and including said body region, said source region, and said drain region.

8. The semiconductor structure of claim 1, wherein said semiconductor substrate comprises:
    a bottom substrate layer;
    an intermediate substrate layer comprising an insulator material and vertically abutting said bottom substrate layer; and
    a top semiconductor layer abutting a top surface of said intermediate substrate layer and including said body region, said source region, and said drain region.

9. The semiconductor structure of claim 1, wherein a longitudinal compressive stress is applied to said channel along a direction connecting said source region and said drain region, whereby mobility of charge carriers is enhanced in said region.

10. A semiconductor structure comprising a first field effect transistor and a second field effect transistor located on a semiconductor substrate,
    wherein said first field effect transistor comprises:
        a first body region including a first channel-containing body portion having a doping of a first conductivity type and comprising a silicon-germanium alloy having a first atomic concentration of germanium and including a first channel;
        a first source region having a doping of a second conductivity type and comprising a silicon-germanium alloy having a second atomic concentration of germanium, wherein said second atomic concentration is greater than said first atomic concentration, and wherein said second conductivity type is the opposite of said first conductivity type; and
        a first drain region having a doping of said second conductivity type and comprising a silicon-germanium alloy having said second atomic concentration of germanium,
    and wherein said second field effect transistor comprises:
        a second body region including a second channel-containing body portion having a doping of second conductivity type and comprising a silicon-germanium alloy having said first atomic concentration of germanium and including a second channel;
        a second source region having a doping of said first conductivity type and comprising silicon and being substantially free of germanium; and
        a second drain region having a doping of first conductivity type and comprising silicon and being substantially free of germanium.

11. The semiconductor structure of claim 10, wherein said second body region further includes:
    a second source-side body portion comprising intrinsic epitaxial silicon and being substantially free of germanium; and
    a second drain-side body portion comprising intrinsic epitaxial silicon and being substantially free of germanium.

12. The semiconductor structure of claim 11, wherein said second source region abuts and is epitaxially aligned to said second source-side body portion, and wherein said second drain region abuts and is epitaxially aligned to said second drain-side body portion.

13. The semiconductor structure of claim 12, wherein said second channel-containing body portion abuts and is epitaxially aligned to said second source-side body portion and said second drain-side body portion.

14. The semiconductor structure of claim 10, further comprising:
    a second source extension region laterally abutting said second source region and abutting said second channel-containing body portion and a second gate dielectric, comprising a silicon-germanium alloy having said first atomic concentration of germanium, and having a doping of said first conductivity type; and
    a second drain extension region laterally abutting said second drain region and abutting said second channel-containing body portion and said second gate dielectric, comprising a silicon-germanium alloy having said first atomic concentration of germanium, and having a doping of said first conductivity type.

* * * * *